United States Patent
Mur et al.

(10) Patent No.: US 10,276,738 B2
(45) Date of Patent: Apr. 30, 2019

(54) PHOTOVOLTAIC CELL, INCLUDING A CRYSTALLINE SILICON OXIDE PASSIVATION THIN FILM, AND METHOD FOR PRODUCING SAME

(75) Inventors: Pierre Mur, Crolles (FR); Hubert Moriceau, Saint-Egreve (FR); Pierre-Jean Ribeyron, Saint Ismier (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/522,901

(22) PCT Filed: Jan. 26, 2011

(86) PCT No.: PCT/FR2011/000050
§ 371 (c)(1),
(2), (4) Date: Jul. 18, 2012

(87) PCT Pub. No.: WO2011/092402
PCT Pub. Date: Aug. 4, 2011

(65) Prior Publication Data
US 2012/0291861 A1    Nov. 22, 2012

(30) Foreign Application Priority Data
Jan. 27, 2010  (FR) ..................... 10 00309

(51) Int. Cl.
*H01L 31/18* (2006.01)
*H01L 31/0745* (2012.01)
*H01L 31/0747* (2012.01)

(52) U.S. Cl.
CPC ...... *H01L 31/0745* (2013.01); *H01L 31/0747* (2013.01); *H01L 31/1868* (2013.01); *Y02E 10/50* (2013.01); *Y02P 70/521* (2015.11)

(58) Field of Classification Search
CPC ........... H01L 21/0223; H01L 21/02255; H01L 21/31662; H01L 21/31658;
(Continued)

(56) References Cited

U.S. PATENT DOCUMENTS 5,057,439 A * 10/1991 Swanson et al. ............... 438/98
5,693,578 A * 12/1997 Nakanishi et al. ........... 438/770
(Continued)

FOREIGN PATENT DOCUMENTS

JP    A-07-38111    2/1995
JP    A-07-66437    3/1995
(Continued)

OTHER PUBLICATIONS

D.W. Hess. 1999. "Plasma-assited oxidation, anodization, and nitridation of silicon".*
(Continued)

*Primary Examiner* — Mayla Gonzalez Ramos
(74) *Attorney, Agent, or Firm* — Oliff PLC

(57) ABSTRACT

A heterojunction photovoltaic cell includes at least one crystalline silicon oxide film directly placed onto one of the front or rear faces of a crystalline silicon substrate, between said substrate and a layer of amorphous or microcrystalline silicon. The thin film is intended to enable the passivation of said face of the substrate. The thin film is more particularly obtained by radically oxidizing a surface portion of the substrate, before depositing the layer of amorphous silicon. Moreover, a thin layer of intrinsic or microdoped amorphous silicon can be placed between said think film and the layer of amorphous or microcrystalline silicon.

21 Claims, 5 Drawing Sheets

(58) Field of Classification Search
CPC .......... H01L 21/02238; H01L 31/0747; H01L 31/1868; H01L 31/02366; H01L 31/022466; H01L 31/022425; H01L 31/1804; H01L 31/068; H01L 31/02168; H01L 31/02167; H01L 31/18; H01L 31/0682; H01L 31/1864; H01L 31/02363; H01L 31/0352; H01L 31/0745; H01L 31/075; H01L 31/077; Y02E 10/547; Y02E 10/50; Y02E 10/52; Y02E 10/546; Y02E 10/545; Y02P 70/521
USPC .......................................... 136/255, 256, 261
See application file for complete search history.

(56) References Cited

U.S. PATENT DOCUMENTS

| | | | |
|---|---|---|---|
| 7,737,357 B2* | 6/2010 | Cousins | 136/261 |
| 2001/0029978 A1* | 10/2001 | Nakai et al. | 136/258 |
| 2002/0104822 A1 | 8/2002 | Naydenkov et al. | |
| 2003/0207589 A1 | 11/2003 | Li et al. | |
| 2007/0256728 A1 | 11/2007 | Cousins | |
| 2008/0083830 A1 | 4/2008 | Tokunaga et al. | |
| 2010/0154883 A1* | 6/2010 | Komatsu | H01L 31/02167 136/256 |
| 2010/0186802 A1* | 7/2010 | Borden | 136/255 |
| 2010/0275996 A1* | 11/2010 | Tawada | H01L 31/02366 136/258 |
| 2010/0307562 A1* | 12/2010 | Swanson et al. | 136/244 |

FOREIGN PATENT DOCUMENTS

| | | |
|---|---|---|
| JP | A-2000-235975 | 8/2000 |
| JP | B2-3271990 | 4/2002 |
| JP | A-2005-175023 | 6/2005 |
| JP | A-2005-524977 | 8/2005 |
| JP | A-2007-194485 | 8/2007 |
| JP | A-2008-300440 | 12/2008 |
| JP | A-2011-061030 | 3/2011 |
| WO | WO 98/43304 A1 | 10/1998 |
| WO | WO 03/094218 A2 | 11/2003 |
| WO | WO 2009/094578 A2 | 7/2009 |
| WO | WO 2009/120631 A2 | 10/2009 |
| WO | WO 2009120631 A2 * | 10/2009 |

OTHER PUBLICATIONS

Sritharathikhun et al., "Optimization of Amorphous Silicon Oxide Buffer Layer for High-Efficiency p-Type Hydrogenated Microcrystalline Silicon Oxide/n-Type Crystalline Silicon Heterojunction Solar Cells," *Japanese Journal of Applied Physics*, vol. 47, No. 11, pp. 8452-8455, 2008.

Huran et al., "Silicon Oxide Films Prepared by Plasma Oxidation of Silicon and Their Application for Tunnel Mis Diodes," *Acta. Phys. Slov.*, vol. 39, No. 2, pp. 108-115, Jan. 1, 1990.

International Search Report issued in Application No. PCT/FR2011/000050; dated Jun. 4, 2012 (With Translation).

Apr. 30, 2015 Office Action issued in Chinese Application No. 201180007552.X.

Cui et al., "Rapid thermal oxidation of silicon in ozone", Journal of Applied Physics, Jun. 1, 2000, pp. 8181-8186, vol. 87, No. 11, American Institute of Physics.

Edwards et al., "Effect of texturing and surface preparation on lifetime and cell performance in heterojunction silicon solar cells", Solar Energy Materials & Solar Cells, pp. 1373-1377, 92, 11, 2008.

Fesquet et al., "Modification of textured silicon wafer surface morphology for fabrication of heterojunction solar cell with open circuit voltage over 700 mV", IEEE, pp. 754-758, 2009.

Kerr et al., "Surface recombination velocity of phosphorus-diffused silicon solar cell emitters passivated with plasma enhanced chemical vapor deposited silicon nitride and thermal silicon oxide", Journal of Applied Physics, pp. 3821-3826, vol. 89, No. 7, Apr. 1, 2001.

Kim et al., "Oxide growth on silicon (100) in the plasma phase of dry oxygen using an electron cyclotron resonance source", Journal of Vacuum Science and Technology B14(4), pp. 2667-2673, Jul./Aug. 1996.

Miki et al., "Selective Etching of Native Oxide by Dry Processing Using Ultra Clean Anhydrous Hydrogen Fluoride", IEEE, International Electron Devices meeting, Technical Digest, San Francisco, pp. 730-733, 1988.

Pena et al., "Hydrogen plasma etching of silicon dioxide in a hollow cathode system", Thin Solid Films 518, pp. 3156-3159, 2010.

Sakoda et al., "Additional Plasma Surface Texturing for Single-Crystalline Silicon Solar Cells Using Dielectric Barrier Discharge", Japanese Journal of Applied Physics, pp. 1730-1731, vol. 44, No. 4A, 2005.

* cited by examiner

PHOTOVOLTAIC CELL, INCLUDING A CRYSTALLINE SILICON OXIDE PASSIVATION THIN FILM, AND METHOD FOR PRODUCING SAME

TECHNICAL FIELD OF THE INVENTION

The invention relates to a heterojunction photovoltaic cell including a crystalline silicon substrate with a given doping type and a layer of amorphous or microcrystalline silicon, as well as a method for producing at least one such a photovoltaic cell.

STATE OF THE ART

A heterojunction photovoltaic cell is made of a multilayer stack making it possible to directly convert the photons received into an electric signal. The heterojunction is in particular formed by a crystalline silicon substrate of a given doping type (n or p) and by an amorphous silicon layer of a doping type opposite to that of the substrate.

Moreover, an intermediate layer, called "electric passivation" layer, is generally placed between the two elements forming the heterojunction, in order to improve the interface characteristics of the heterojunction and thus the effectiveness of the conversion. As indicated in the patent application US2001/0029978, this intermediate layer is in general a layer of intrinsic amorphous silicon.

As an example, FIG. 1 illustrates a particular embodiment of a photovoltaic cell according to the anterior art, as described in the patent application US2001/0029978. The heterojunction photovoltaic cell comprises a crystalline silicon substrate 1, for example n-doped and including a front face 1a, uniformly and successively covered by:
  a layer of intrinsic amorphous silicon 2,
  a layer of amorphous silicon 3, for example p-doped to form the heterojunction with the substrate 1,
  an electrode 4, for example made of indium tin oxide (or ITO),
  and a current collector 5 in the form of a comb.

The front face 1a of the substrate 1 is moreover textured (or structured) in order to increase the optical containment of the cell.

In FIG. 1, the rear face 1b of the substrate 1 is flat and covered with an electrode 6. It can, however, in other cases, be textured and covered with a multi-layer stack as represented in FIG. 2. Thus, in this embodiment, the rear face 1b of the substrate 1 is uniformly and successively covered by:
  a layer of intrinsic amorphous silicon 7,
  a layer of amorphous silicon 8, very strongly doped, for example, of n-doped type,
  an electrode 9, made of ITO for example
  and a current collector 10 in the form of a comb.

Thus, as illustrated in FIGS. 1 and 2, the heterojunction photovoltaic cells require an uniform deposition of a plurality of very fine layers (about from some nanometers to a few tens of nanometers) on a substrate whose at least one face can advantageously be textured. By uniform deposition of a thin layer, also sometimes called conformal deposition of a thin layer, it is understood the deposition of a thin layer with an substantially constant thickness in order to follow the relief of the face on which the thin layer is deposited.

However, the step of texturing at least one face of the substrate, almost always necessary, does not facilitate the good uniform distribution of these layers. In particular, the texturing step induces an important increase of the developed surface. Moreover, in the field of the photovoltaic cells, it is common to texture at least one face of the substrate in the form of pyramids. However, the sides of the obtained pyramids are often very rough and the summits and valleys of the pyramids are abrupt (radius of curvature in general lower than 30 nm), which is detrimental to a perfect thickness uniformity for the layers successively deposited on the textured face. As an example, the patent application US2001/0029978 proposes to carry out a wet isotropic etching, using a hydrofluoric acid (HF) and nitric acid solution, in order to round off the zones "b" between two pyramids. However, this etching is too important, about 2 µm or more, and it does not make it possible to smooth the sides of the pyramids on the nanometric level.

In addition, the texturing step, as well as the cleaning steps, the etching steps and the waiting times before the depositions can generate a (particulate and/or metal) contamination of the surface of the textured face of the substrate, which causes an important increase of the state density of the surface of the textured substrate. Thus, these problems of pollution are detrimental to a good passivation of the surface and thus to high outputs despite the use of a transition layer of intrinsic amorphous silicon as a passivation layer.

In the article "Optimization of Amorphous Silicon Oxide Buffer Layer for High-Efficiency p-Type Hydrogenated Microcrystalline Silicon Oxide/n-type Crystalline Silicon Heterojunction Solar Cell" of J. Sritharathiikhun et al. (Japanese Newspaper of Applied Physics, Vol. 47, No. 11, 2008, pp8452-8455), it is proposed to use a surface passivation layer of intrinsic amorphous silicon oxide (i-a-SiO:H) between a n-doped crystalline silicon substrate (n-a-Si:H) and a layer of p-doped microcrystalline silicon oxide (p-µc-SiO:H). Such a passivation layer is deposited by a technique of plasma enhanced chemical vapor deposition at a very high frequency (VHF-PECVD). Moreover, the optimal thickness of such a layer is of 6 nm. However, making such a passivation layer causes the formation of many defects at the interface between the n-doped crystalline silicon substrate and said passivation layer.

OBJECT OF THE INVENTION

The object of the invention is to propose a heterojunction photovoltaic cell with a good surface passivation, while being easy to implement.

According to the invention, this object is reached by the fact that a heterojunction photovoltaic cell including a crystalline silicon substrate with a given doping type and a layer of amorphous or microcrystalline silicon is characterized in that it comprises at least one crystalline silicon oxide thin film, directly deposited on a face of the substrate, between said substrate and said layer of amorphous or microcrystalline silicon.

According to a development of the invention, the crystalline silicon oxide thin film is composed of a surface portion of the substrate obtained by radical oxidation.

According to another development, the crystalline silicon oxide thin film has a thickness lower than or equal to 2 nanometers.

According to the invention, this object is also reached by the fact that the crystalline silicon oxide thin film is carried out, before the formation of the layer of amorphous or microcrystalline silicon, by surface radical oxidation of a surface of the substrate.

BRIEF DESCRIPTION OF THE DRAWINGS

Other advantages and characteristics will more clearly arise from the following description of particular embodiments of the invention given as nonrestrictive examples and represented in the annexed drawings in which.

DESCRIPTION OF PARTICULAR EMBODIMENTS

Figure 1:
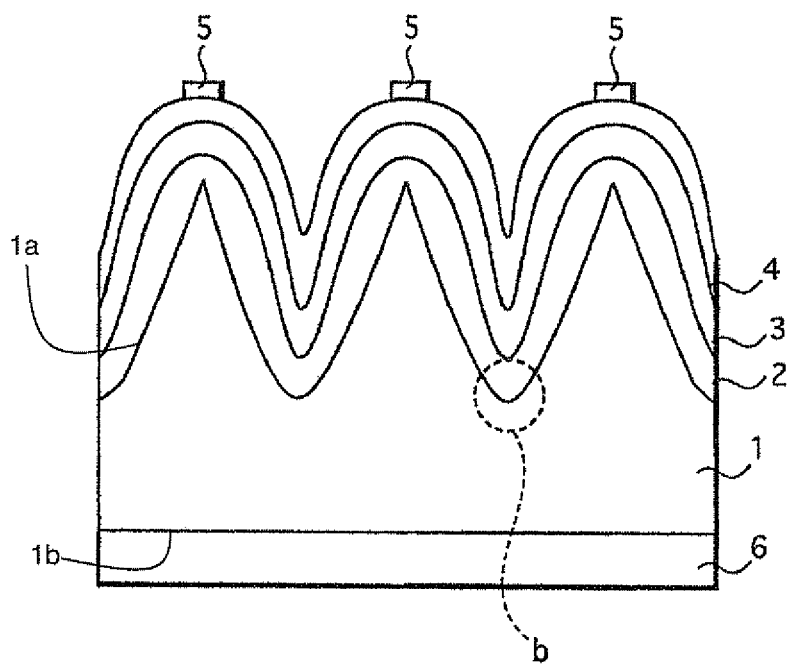
FIG. 1 represents, in schematic and sectional views, a particular embodiment of a photovoltaic cell according to the anterior art.
Figure 3:
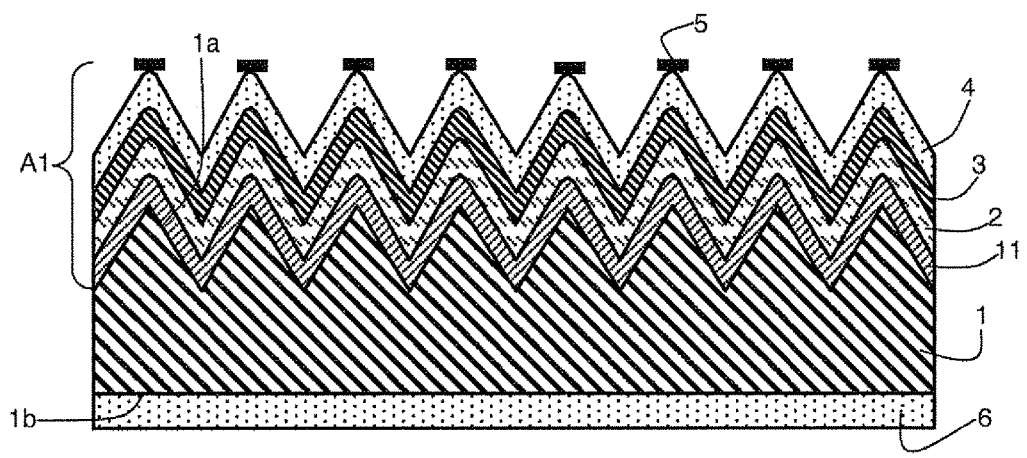
FIGS. 3 to 9 illustrate various embodiments of photovoltaic cells according to the invention.

The photovoltaic cell according to FIG. 3 has a multi-layer stack substantially similar to that of the photovoltaic cell represented in FIG. 1. However, in FIG. 3, a crystalline silicon oxide thin film 11 is deposited between the crystalline silicon substrate 1 and the thin layer of intrinsic amorphous silicon 2.

The unit formed by the thin film 11, the layer of intrinsic amorphous silicon 2, the layer of p-doped amorphous silicon 3, the electrode 4 and the current collector 5 then constitute a multi-layer stack arranged on the front face 1a of the substrate 1 and noted A1 in FIG. 3.

More particularly, the thin film 11 is arranged directly on the front face 1a of the substrate 1 of n-doped crystalline silicon, between said substrate 1 and the layer 2 of intrinsic amorphous silicon. Consequently, it is directly in contact with the front face 1a of the substrate 1. Moreover, advantageously, it has a thickness lower than or equal to 2 nanometers and still advantageously between 0.1 nm and 2 nm and typically of about 0.5 nm.

More particularly, the thin film 11 is a thin film obtained by oxidizing the silicon of a surface portion of the substrate 1, before the formation of the successive thin layers 2, 3, 4 and 5 of the stack A1. By surface portion of the substrate 1, it is understood a zone of the substrate 1, extending from a free face of the substrate 1 to the interior of the latter, with a very low thickness (advantageously lower than 2 nm). Moreover, the thin film 11 is made of crystalline silicon oxide, i.e. an oxide in a crystalline form. In particular, it is supposed that the crystalline form of the silicon oxide can be, in certain cases, the tridymite form for a silicon substrate having a crystallographic plane (100).

Moreover, said oxidation is a radical surface oxidation, i.e. an oxidation carried out by means of radicals (or free radicals). Such radicals are in particular oxygenated radicals, for example obtained from oxygen, ozone and/or water.

The thus-obtained radicals then oxidize silicon on a surface portion of the substrate 1. Moreover, the silicon oxide thus obtained during the radical oxidation is at least partly in a crystalline form. More particularly, the radical surface oxidation of the silicon substrate is advantageously controlled so as to form said thin crystalline film on the surface of the silicon substrate. However, the radical surface oxidation of the substrate can, in certain cases, involve the additional formation, on the crystalline silicon oxide, of silicon oxide in an amorphous form. However, the crystalline silicon oxide forming the thin film 11 remains interposed between the substrate 11 and the amorphous silicon oxide. Moreover, the amorphous silicon oxide, advantageously formed during the radical surface oxidation can possibly be removed by stripping during an intermediate step following the radical surface oxidation and, more particularly, before the formation of the other layers of the stack A1.

Advantageously, the oxidation is assisted by means of a plasma or by applying ultraviolet radiations to the surface of the substrate to be oxidized. The plasma or ultraviolet radiations treatment facilitates, in particular, the formation of the free radicals used to oxidize the silicon of the substrate 1. They are, more particularly, radicals of the $O^\bullet$, $O_2^\bullet$ and/or $OH^\bullet$ type, according to the type of treatment and are obtained in particular from oxygen and/or ozone and/or water.

According to a particular embodiment, the oxidation of the surface portion of the substrate 1 can be carried out from oxygen and ultraviolet radiations with wavelengths ranging between 160 nm and 400 nm. The wavelengths of the ultraviolet radiations used are, for example, of approximately 185 nm and approximately 254 nm. In this particular embodiment, oxygen dissociates, under the action of the ultraviolet radiations, into free radicals $O^\bullet$ and into ozone. The free radicals can oxidize the silicon surface.

Moreover, the temperature during the oxidation operation can be comprised between the ambient temperature and approximately 900° C., while the pressure can be comprised between approximately $10^{-4}$ and approximately $10^5$ Pa. However, in an advantageous way, the temperature and the pressure are respectively the ambient temperature and the ambient pressure.

Once the thin film 11 formed, the method for producing at least one photovoltaic cell continues with the successive deposition of thin layers. In particular, in the embodiment represented in FIG. 3, the formation of the thin film 11 is directly followed by the following successive depositions:

deposition of the thin layer 2 of intrinsic amorphous silicon, deposition of the thin layer 3 of p-doped amorphous silicon onto said thin film 11, deposition of the electrode 4 onto the thin layer 3, deposition of the current collector 5 onto the electrode 4, and deposition of the electrode 6 onto the rear face 1b of the substrate 1.

As mentioned above, an intermediate step to remove the amorphous silicon oxide, possibly formed on the thin film 11 during the operation of radical oxidation, can be carried out before the successive deposition of said thin layers.

Thus, it was noted that the presence of a crystalline silicon oxide thin film on one of the faces of the substrate 1 and, in particular when it is carried out by a radical oxidation, makes it possible to obtain important passivation characteristics, the crystalline silicon oxide having a very good intrinsic quality. Thus, such a crystalline silicon oxide thin film makes it possible to prevent the is charge carriers from being trapped while recombining. It thus plays the part of a tunnel oxide by ensuring a surface passivation of the substrate 1. Thus, it is possible to increase the open circuit tension of the photovoltaic cell and potentially to amplify the short-circuit current and to vary the form factor of the cell without degrading the output.

Moreover, that makes it possible to facilitate the method for producing one or more photovoltaic cells. Indeed, the surface of the substrate 1 thus covered with a thin film of oxide is stable for a longer duration, which makes it possible to increase the possible waiting time, before carrying out the following steps of the producing method (deposition of the other thin layers). Moreover, in certain cases and according to cleaning conditions, it is not necessary to remove the native oxide present on the surface of the substrate 1, before forming the crystalline silicon oxide thin film. The latter can be transformed, under certain conditions, into a crystalline form during the step of radical oxidation. Lastly, the fact of making at least one crystalline silicon oxide thin film as a passivation layer makes it possible to free the process from a step of cleaning the substrate with hydrofluoric acid before depositing the intrinsic amorphous silicon, which makes it possible to improve the process safety.

Figure 2:
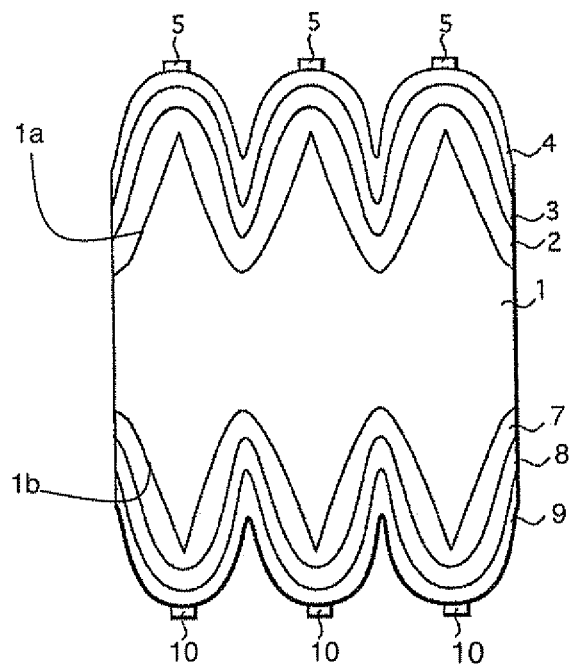
FIG. 2 represents, in schematic and sectional views, an alternative embodiment of the photovoltaic cell according to FIG. 1.

In FIG. 3, the rear face 1b of the substrate 1 is flat and it is covered, as in the embodiment according to FIG. 1, with an electrode 6. On the other hand, as illustrated in FIG. 4, the rear face 1b can be textured and covered with a multi-layer stack as represented in FIG. 2, i.e. uniformly and successively by:

a layer of intrinsic amorphous silicon 7,
a layer of amorphous silicon 8, very strongly doped, for example, n-doped,
an electrode 9, made of ITO for example,
and a current collector 10 in the form of a comb.

In addition, an additional thin film 12 can be deposited, in certain embodiments, onto the rear face 1b of the substrate 1.

Figure 4:
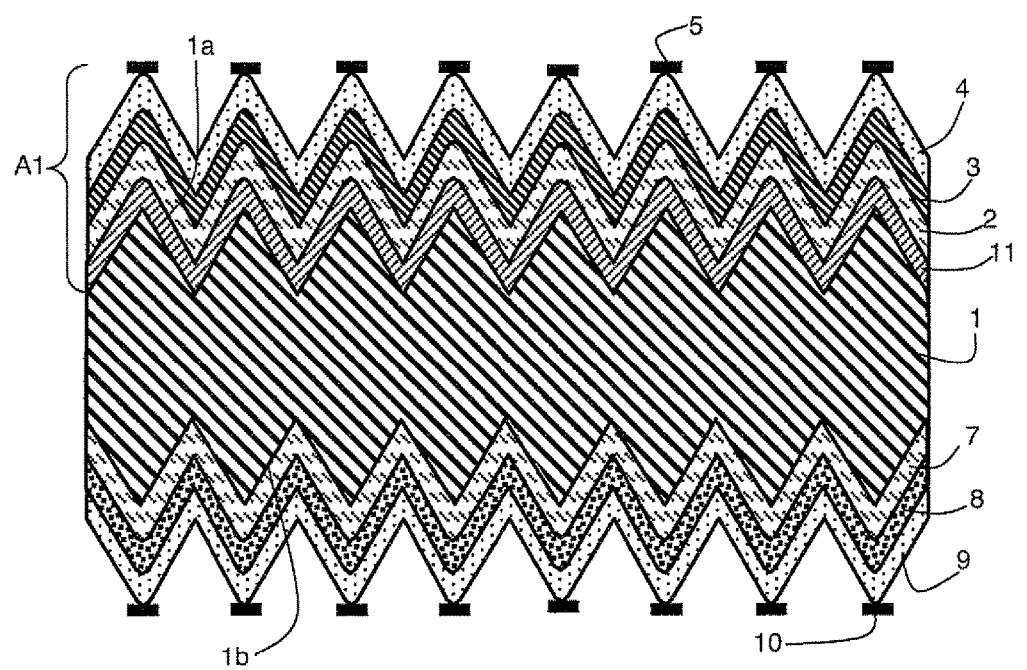
Figure 5:
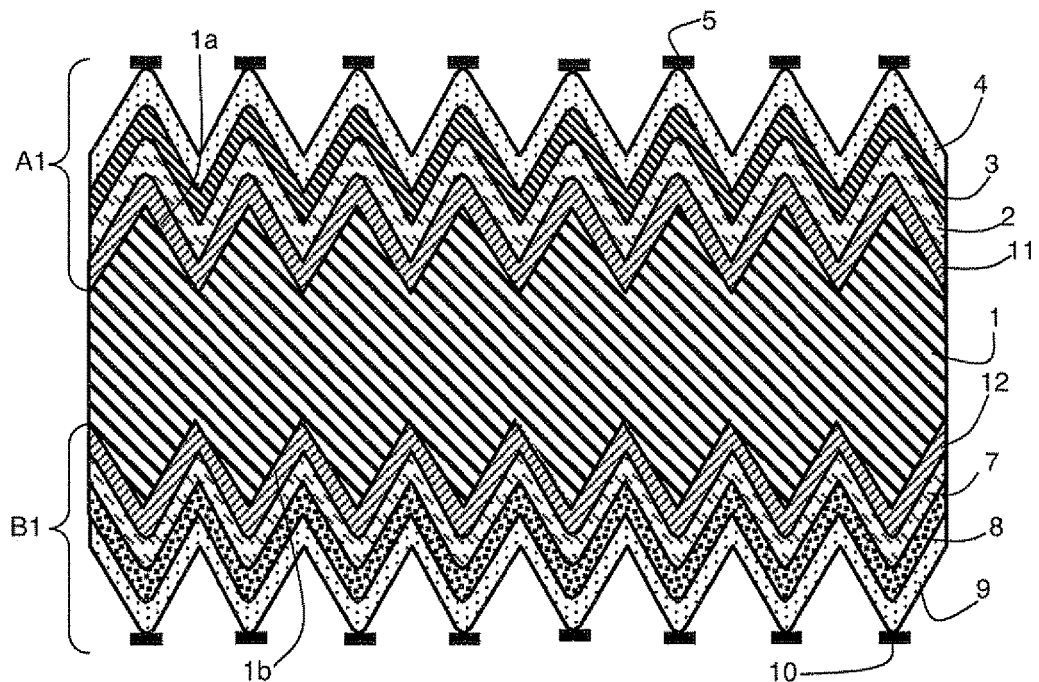

Thus, according to an alternative embodiment and as represented in FIG. 5, the cell can comprise a front face 1a covered with the same multi-layer stack A1 as that represented in FIGS. 3 and 4. On the other hand, like the front face 1a, the rear face 1b of the substrate 1 is textured and, moreover, it is covered with an additional crystalline silicon oxide thin film 12. Said additional thin film 12 is covered with a multi-layer stack formed of a thin intrinsic amorphous layer 7, a thin layer of n-doped amorphous silicon 8, an electrode 9 and a current collector 10, the unit then forming a multi-layer stack covering the rear face 1b of the substrate 1 and noted B1 in FIG. 5.

In certain cases, the very good intrinsic quality of the crystalline silicon oxide is sufficient to obtain a good surface passivation and can obviate the need of a thin passivation layer 2 of intrinsic amorphous silicon between said film and the thin layer of doped amorphous silicon.

Then, the thin film 11 can be directly deposited between the substrate 1 and the layer 3 of p-doped amorphous silicon. Thus, in these embodiments, it can be envisaged to replace the multi-layer stack A1 by a multi-layer stack A2 differing from the stack A1 in that the thin layer of intrinsic silicon 2 between the thin film 11 and the thin layer of p-doped amorphous silicon 3 is suppressed. Such a stack A2 could then be associated with various embodiments for the rear face 1b of the substrate 1 as illustrated in FIGS. 6 to 9.

Figure 6:
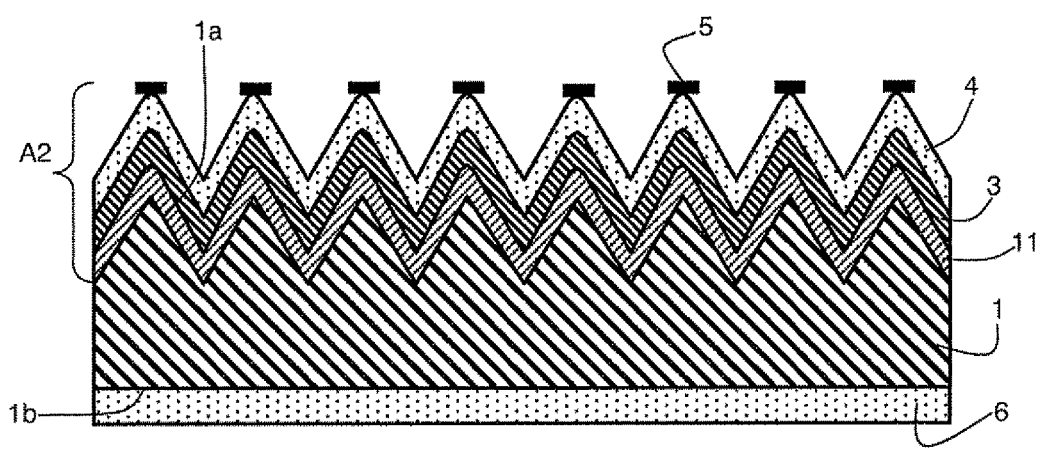

Thus, said stack A2 covering the front face 1a of the substrate 1 is associated, in FIG. 6, with an electrode 6 covering the flat rear face 1b of the substrate 1.

Figure 7:
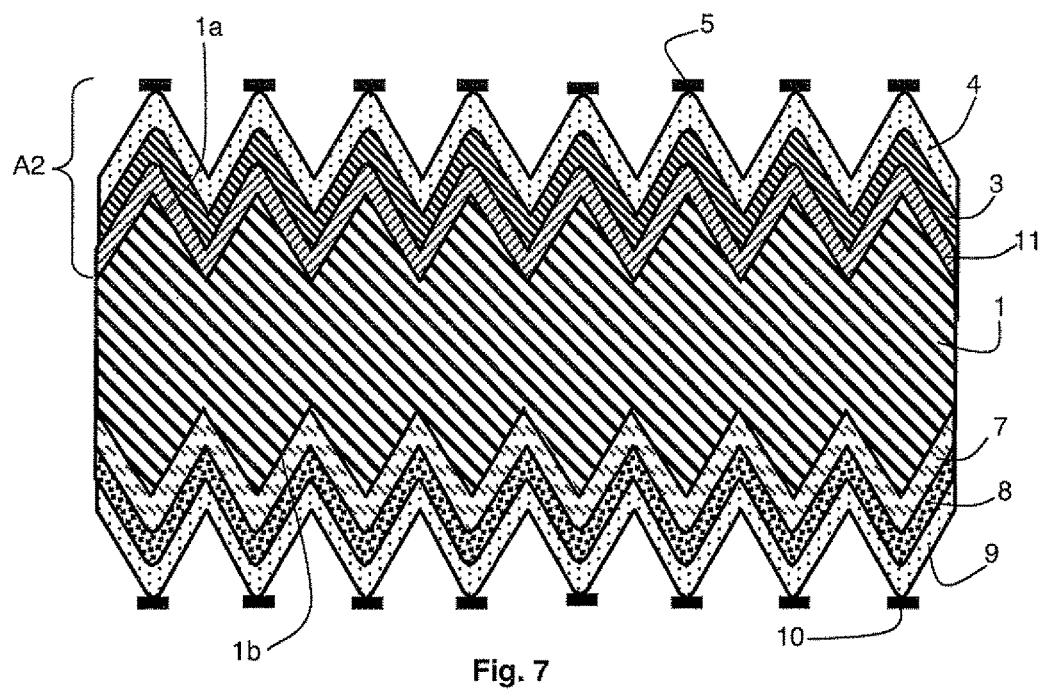

In FIG. 7, the rear face 1b is textured like the front face 1a of the substrate 1 and it is covered with a multi-layer stack such as that represented in FIG. 2, i.e. a multi-layer stack not including the additional crystalline silicon oxide thin film 12.

Figure 8:
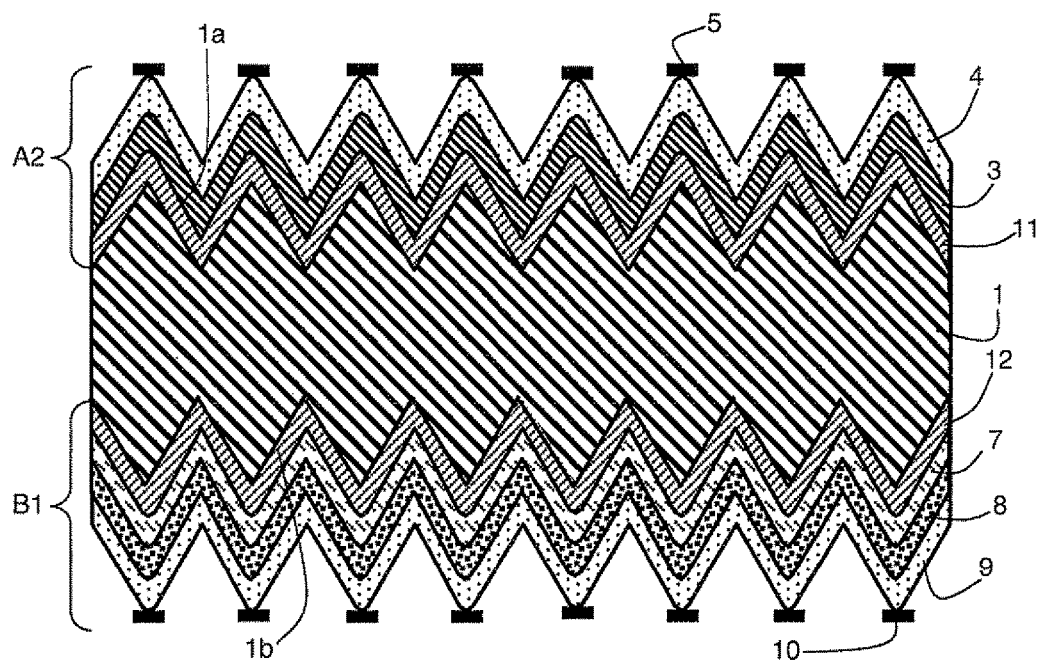

In FIG. 8, the rear face 1b of the substrate 1 is also textured like the front face 1b of the substrate and it is covered with a multi-layer stack B1, i.e. a stack including an additional thin film 12 inserted between the substrate 1 and the thin layer of n-doped amorphous silicon 8.

Figure 9:
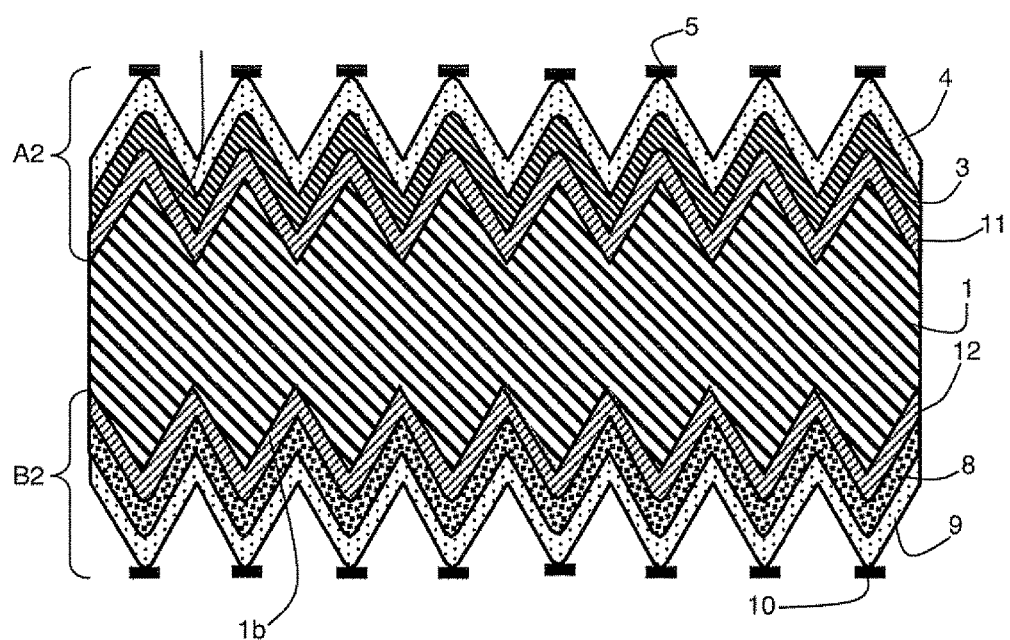

Lastly, in FIG. 9, the rear face 1b of the substrate 1 is also textured like the front face 1b of the substrate and it is covered with a multi-layer stack 62. The multi-layer stack B2 differs from the stack B1 in that it does not include the layer 7 of intrinsic amorphous silicon arranged between the additional thin film 12 and the layer 8 of amorphous silicon.

When the photovoltaic cell comprises a thin film 11 arranged on the front face 1a of the substrate 1 as well as an additional thin film 12 arranged on the rear face 1b of the substrate 1, the two thin films 11 and 12 can be realized either in a simultaneous way, or in a successive way.

In the case the two thin films 11 and 12 are realized in a successive way, the photovoltaic cell can advantageously be made as follows:

the thin film 11, the possible thin layer 2 of intrinsic amorphous silicon and the layer of p-doped amorphous silicon 3 are successively formed on the front face 1a of the substrate 1 to for form the heterojunction,
then, the additional thin film 12, the possible thin layer of intrinsic amorphous silicon 7 and the layer 8 of n-doped amorphous silicon are successively formed on the rear face 1b of the substrate 1,
and, finally, the electrodes 4 and 9 as well as the current collectors 5 and 10 respectively associated with said electrodes 4 and 9 are formed on their respective stack.

Advantageously, each of the two thin films 11 and 12 are made by radical oxidation, by means of free radicals such as oxygenated radicals and possibly with the help of a plasma treatment or ultraviolet radiations.

According to another alternative embodiment, the photovoltaic cell can also comprise only one crystalline silicon oxide thin film, placed not on the front face 1a of the substrate 1 (cases of FIGS. 3, 4, 6 and 7), but on the rear face 1b of the substrate 1. The crystalline silicon oxide thin film is always advantageously made by radical oxidation, by means of oxygenated radicals and possibly with the help of a plasma treatment or ultraviolet radiations. In this case, the front face 1a is advantageously covered with a thin layer of intrinsic amorphous silicon 2 arranged between the substrate 1 and the thin layer of p-doped amorphous silicon 3. The rear face 1b can (or cannot) comprise a thin layer of intrinsic amorphous silicon 7 between the crystalline silicon oxide thin film and the layer 8 of doped amorphous silicon.

The invention is not limited to the above-described embodiments, in particular with regard to the doping type (n or p) of the substrate 1 and the layers 3 and 8 of doped amorphous silicon.

Consequently, the invention is not limited to the embodiments including a n-doped crystalline silicon substrate and layers 3 and 8 of amorphous silicon, respectively p-doped and n-doped. The layer 3 of amorphous silicon must have a doping type (p or n) opposite to the doping type (n or p) of the substrate 1, in order to form the heterojunction and the layer 8 of amorphous silicon arranged on the side of the rear face 1b of the substrate 1 must have the same doping type (n or p) as that of the substrate 1 (n or p).

In addition, instead of being made of amorphous silicon, the thin layers 3 and 8 can also be made of microcrystalline silicon.

Lastly, instead of using intrinsic amorphous silicon for layers 2 and 7, it is possible to use slightly doped, also called microdoped, amorphous silicon, with the same doping type as that of the layer 3 or 8 of amorphous silicon intended to be arranged on said layer 2 or 7. By slightly doped or microdoped amorphous silicon, it is understood a doping substantially lower than the doping levels usually used. Thus, as an example, the concentration of doping agents of each layer 2 and 7 of amorphous silicon can be between $1 \times 10^{16}$ and $1 \times 10^{18}$ at/cm$^3$, while each of the thin layers 3 and 8 of amorphous silicon can have a concentration of doping agents between $1 \times 10^{19}$ at.cm$^3$ and $1 \times 10^{22}$ at.cm$^3$.

Replacing intrinsic amorphous silicon by microdoped amorphous silicon allows to obtain, because of the low doping level, a low localized state density and thus a low rate of recombination of the carriers at the interface with the substrate as well as a high open circuit tension. Moreover, the microdoped amorphous layer has a conductivity substantially higher than that of an intrinsic amorphous layer, which reduces the series resistance of the cell and substantially improves the form factor thereof.

The invention claimed is:

1. A heterojunction photovoltaic cell comprising:
a crystalline silicon substrate with a given doping type, provided with a first face and a second face;
a layer of amorphous or microcrystalline silicon, having a doping type opposite to the doping type of the crystalline silicon substrate so as to form a p/n heterojunction;
at least one crystalline silicon oxide thin film produced by radical surface oxidation of a surface of the first face of the crystalline silicon substrate, the at least one crystalline silicon oxide thin film being positioned directly on the first face of the crystalline silicon substrate, between the crystalline silicon substrate and the layer of amorphous or microcrystalline silicon; and
a layer of amorphous silicon oxide arranged directly on the at least one crystalline silicon oxide thin film, between the at least one crystalline silicon oxide thin film and the layer of amorphous or microcrystalline silicon; and
wherein:
the at least one crystalline silicon oxide thin film is a continuous film that covers an entire surface of the first face of the crystalline silicon substrate and has a uniform thickness.

2. The cell according to claim 1, wherein the at least one crystalline silicon oxide thin film is composed of a surface portion of the crystalline silicon substrate.

3. The cell according to claim 1, wherein the at least one crystalline silicon oxide thin film has a thickness less than or equal to 2 nanometers.

4. The cell according to claim 1, further comprising a thin layer of microdoped amorphous silicon interposed between the at least one crystalline silicon oxide thin film and the layer of amorphous or microcrystalline silicon.

5. The cell according to claim 1, further comprising an additional layer of microcrystalline silicon on the second face side of the crystalline silicon substrate, wherein the additional layer of microcrystalline silicon has a doping type identical to the doping type of the crystalline silicon substrate.

6. The cell according to claim 5, further comprising an additional crystalline silicon oxide thin film, arranged directly on the second face of the crystalline silicon substrate, between the crystalline silicon substrate and the additional layer of microcrystalline silicon.

7. The cell according to claim 6, further comprising a thin layer of intrinsic or microdoped amorphous silicon interposed between the additional crystalline silicon oxide thin film and the additional layer of microcrystalline silicon.

8. The cell according to claim 6, wherein the additional crystalline silicon oxide thin film is in direct contact with the additional layer of microcrystalline silicon.

9. The cell according to claim 1, wherein the first face of the crystalline silicon substrate is a textured face with pyramids.

10. A method for producing at least one heterojunction photovoltaic cell comprising a crystalline silicon substrate, a layer of amorphous or microcrystalline silicon, and at least one crystalline silicon oxide thin film, the method comprising:
producing the at least one crystalline silicon oxide thin film by a radical surface oxidation of a surface of the crystalline silicon substrate and a layer of amorphous silicon oxide arranged directly on the at least one crystalline silicon oxide thin film before forming the layer of amorphous or microcrystalline silicon; and
forming a p/n junction;
wherein:
the crystalline silicon substrate has a given doping type and is provided with a first face and a second face;
the layer of amorphous silicon oxide is arranged between the at least one crystalline silicon oxide thin film and the layer of amorphous or microcrystalline silicon;
the layer of amorphous or microcrystalline silicon has a doping type opposite to the doping type of the crystalline silicon substrate so as to form a p/n heterojunction; and
the at least one crystalline silicon oxide thin film is:
positioned directly on the first face of the crystalline silicon substrate between the crystalline silicon substrate and the layer of amorphous or microcrystalline silicon; and
a continuous film that covers an entire surface of the first face of the crystalline silicon substrate and has a uniform thickness.

11. A heterojunction photovoltaic cell comprising:
a crystalline silicon substrate with a given doping type, provided with a first face and a second face, the second face of the crystalline silicon substrate being a textured face with pyramids;
a layer of amorphous or microcrystalline silicon, having a doping type identical to a doping type of the crystalline silicon substrate;
at least one crystalline silicon oxide thin film produced by radical surface oxidation of a surface of the second face of the crystalline silicon substrate, the at least one crystalline silicon oxide thin film being positioned directly on the second face of the crystalline silicon substrate between the crystalline silicon substrate and the layer of amorphous or microcrystalline silicon; and
a layer of amorphous silicon oxide arranged directly on the at least one crystalline silicon oxide thin film, between the at least one crystalline silicon oxide thin film and the layer of amorphous or microcrystalline silicon;
wherein:
the at least one crystalline silicon oxide thin film is a continuous film that covers an entire surface of the second face of the crystalline silicon substrate.

12. A method for producing at least one heterojunction photovoltaic cell comprising a crystalline silicon substrate, a layer of amorphous or microcrystalline silicon, and at least one crystalline silicon oxide thin film, the method comprising:
producing the at least one crystalline silicon oxide thin film by a radical surface oxidation of a surface of the crystalline silicon substrate and a layer of amorphous silicon oxide arranged directly on the at least one crystalline silicon oxide thin film before forming the layer of amorphous or microcrystalline silicon; and
forming a p/n junction;
wherein:
the crystalline silicon substrate has a given doping type and is provided with a first face and a second face, the second face of the crystalline silicon substrate being a textured face with pyramids;
the layer of amorphous silicon oxide is arranged between the at least one crystalline silicon oxide thin film and the layer of amorphous or microcrystalline silicon;

the layer of amorphous or microcrystalline silicon has a doping type identical to the doping type of the crystalline silicon substrate; and the at least one crystalline silicon oxide thin film is:

positioned directly on the second face of the crystalline silicon substrate between the crystalline silicon substrate and the layer of amorphous or microcrystalline silicon; and a continuous film that covers an entire surface of the second face of the crystalline silicon substrate.

13. A heterojunction photovoltaic cell comprising:

a crystalline silicon substrate with a given doping type, provided with a first face and a second face;

a layer of amorphous or microcrystalline silicon, having a doping type opposite to the doping type of the crystalline silicon substrate so as to form a p/n heterojunction;

at least one crystalline silicon oxide thin film produced by radical surface oxidation of a surface of the crystalline silicon substrate, the at least one crystalline silicon oxide thin film being a continuous film that covers an entire surface of the first face or an entire surface of the second face of the crystalline silicon substrate between the crystalline silicon substrate and the layer of amorphous or microcrystalline silicon, the first face or the entire surface of the second face of the crystalline silicon substrate being a textured face with pyramids; and a layer of amorphous silicon oxide arranged directly on the at least one crystalline silicon oxide thin film, between the at least one crystalline silicon oxide thin film and the layer of amorphous or microcrystalline silicon.

14. A method for producing at least one heterojunction photovoltaic cell comprising a crystalline silicon substrate, a layer of amorphous or microcrystalline silicon, and at least one crystalline silicon oxide thin film, the method comprising:

producing the at least one crystalline silicon oxide thin film by a radical surface oxidation of a surface of the crystalline silicon substrate and a layer of amorphous silicon oxide arranged directly on the at least one crystalline silicon oxide thin film before forming the layer of amorphous or microcrystalline silicon; and forming a p/n junction;

wherein:

the crystalline silicon substrate has a given doping type and is provided with a first face and a second face;

the layer of amorphous silicon oxide is arranged between the at least one crystalline silicon oxide thin film and the layer of amorphous or microcrystalline silicon;

the layer of amorphous or microcrystalline silicon has a doping type opposite to the doping type of the crystalline silicon substrate so as to form a p/n heterojunction; and the at least one crystalline silicon oxide thin film is a continuous film that covers an entire surface of the first face or an entire surface of the second face of the crystalline silicon substrate between the crystalline silicon substrate and the layer of amorphous or microcrystalline silicon, the first face or the entire surface of the second face of the crystalline silicon substrate being a texture face with pyramids.

15. The method according to claim 10, wherein the radical surface oxidation is carried out at a temperature ranging from ambient temperature to 900° C.

16. The method according to claim 14, wherein the radical surface oxidation is carried out at ambient temperature and ambient pressure.

17. The method according to claim 10, further comprising depositing a thin layer of intrinsic or microdoped amorphous silicon on the at least one crystalline silicon oxide thin film, wherein the method does not comprise a cleaning step before deposition of the thin layer of intrinsic or microdoped amorphous silicon.

18. The cell according to claim 1, wherein the radical surface oxidation is carried out with oxygenated radicals that are not obtained from water.

19. The cell according to claim 1, further comprising a thin layer of intrinsic or microdoped amorphous silicon interposed between the at least one crystalline silicon oxide thin film and the layer of amorphous or microcrystalline silicon, wherein the layer of amorphous or microcrystalline silicon is microcrystalline.

20. The cell according to claim 1, further comprising:

an additional layer of amorphous or microcrystalline silicon on the second face side of the crystalline silicon substrate, the additional layer of amorphous or microcrystalline silicon having a doping type identical to the doping type of the crystalline silicon substrate; and an additional crystalline silicon oxide thin film, arranged directly on the second face of the crystalline silicon substrate, between the crystalline silicon substrate and the additional layer of amorphous or microcrystalline silicon, the additional layer of amorphous or microcrystalline silicon being microdoped.

21. The method according to claim 10, wherein the first face of the crystalline silicon substrate is a textured face with pyramids.

* * * * *